United States Patent [19]

Hatakeyama et al.

[11] Patent Number: 5,481,795

[45] Date of Patent: Jan. 9, 1996

[54] METHOD OF MANUFACTURING ORGANIC SUBSTRATE USED FOR PRINTED CIRCUITS

[75] Inventors: Akihito Hatakeyama, Kadoma; Hiroshi Sogo, Nishinomiya; Tamao Kojima; Yasuhiko Horio, both of Osaka; Masahide Tsukamoto, Nara; Yasushi Fukumura, Kyoto, all of Japan

[73] Assignee: Matsushita Electric Industrial Co., Ltd., Japan

[21] Appl. No.: 258,383

[22] Filed: Jun. 10, 1994

Related U.S. Application Data

[62] Division of Ser. No. 57,972, May 6, 1993, Pat. No. 5,346,750.

[30] Foreign Application Priority Data

| May 6, 1992 | [JP] | Japan | 4-113527 |
| May 20, 1992 | [JP] | Japan | 4-127160 |
| Jul. 6, 1992 | [JP] | Japan | 4-178019 |
| Jan. 12, 1993 | [JP] | Japan | 5-003263 |
| Apr. 5, 1993 | [JP] | Japan | 5-077840 |

[51] Int. Cl.$^6$ .................................. H01K 3/10
[52] U.S. Cl. ................. 29/852; 29/829; 29/830; 174/264; 428/901
[58] Field of Search ................ 174/264; 29/830, 29/829, 852; 156/902; 428/901; 427/97

[56] References Cited

U.S. PATENT DOCUMENTS

| 4,383,363 | 5/1983 | Hayakawa et al. . |
| 4,857,381 | 8/1989 | Suzuki . |
| 4,895,756 | 1/1990 | Suzuki . |
| 5,035,939 | 7/1991 | Conlon . |
| 5,047,283 | 9/1991 | Leatherman et al. . |
| 5,049,435 | 9/1991 | Uno et al. . |
| 5,117,069 | 5/1992 | Higgins, III . |

FOREIGN PATENT DOCUMENTS

| 2296898 | 7/1976 | France . |
| 54-38562 | 3/1979 | Japan . |
| 63-47991 | 2/1988 | Japan . |
| 2-5029 | 1/1990 | Japan . |

OTHER PUBLICATIONS

Patent Abstracts of Japan; vol. 013, No. 230 (E–764) 26 May 1989; & JPA–1–01 037 079 (Shin Kobe Electric Mach Co) 7 Feb. 1989, abstract.

Patent Abstracts of Japan; vol. 015, No. 179 (E–1064) 8 May 1991; & JPA–03 041 794 (Casio Comput Co) 22 Feb. 1991; abstract.

*Primary Examiner*—Carl J. Arbes
*Attorney, Agent, or Firm*—Wenderoth, Lind & Ponack

[57] ABSTRACT

A method of manufacturing an organic substrate used for printed circuits, which includes the steps of forming through-holes in a porous raw material provided with cover films and having compressive shrinkage, filling electro-conductive paste into the through-holes, separating the cover films from the porous raw material filled with the electro-conductive paste in its through-holes, applying metal foils onto the surfaces of the porous raw material from which the cover films have been separated, and compressing the porous raw material applied with the metal foils through heating and pressurization, whereby the electro-conductive substances in the electro-conductive paste are connected for electrical connection between the metal foils.

10 Claims, 10 Drawing Sheets

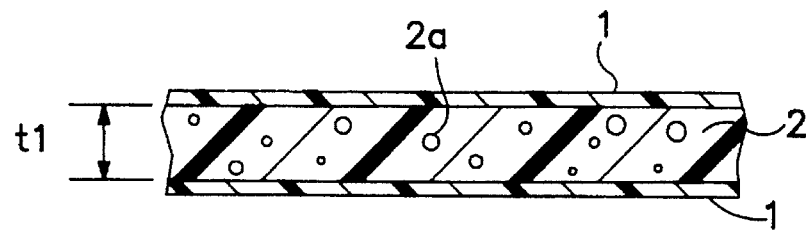
FIG. I(a)
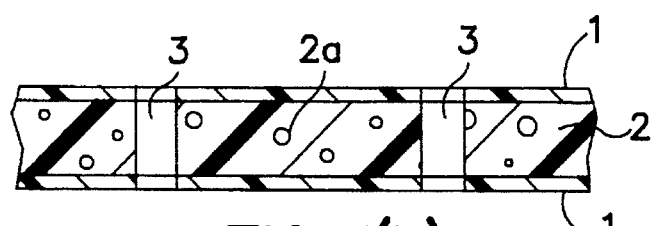
FIG. I(b)
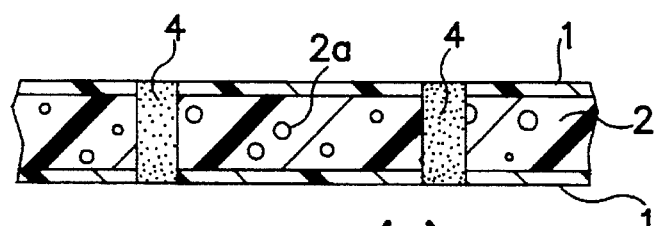
FIG. I(c)
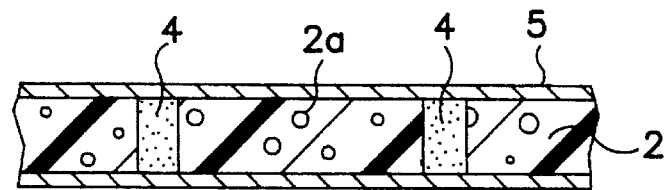
FIG. I(d)
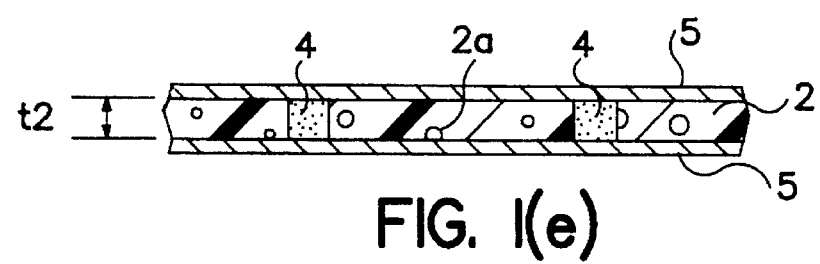
FIG. I(e)

5,481,795

METHOD OF MANUFACTURING ORGANIC SUBSTRATE USED FOR PRINTED CIRCUITS

This is divisional application of Ser. No. 08/057,972, filed May 6, 1993 now U.S. Pat. No. 5,346,750.

BACKGROUND OF THE INVENTION

1. Field of the Invention

The present invention generally relates to a printed circuit board, and more particularly, to a method of manufacturing a printed circuit organic substrate having metal foils on its opposite surfaces, and the organic substrate manufactured thereby.

2. Description of the Prior Art

Recently following the tendency towards compact size and higher mounting density of electronic appliances, multilayered printed circuit boards have been strongly demanded not only for industrial applications, but also for daily life in general. In the multilayered printed circuit boards as referred to above, a connecting method for effecting an inner-via-hole connection between the circuit patterns in a plurality of layers is required together with a construction at high reliability.

Referring to FIGS. 10(a) to 10(e), a manufacturing method of a conventional two-layered printed circuit board will be described hereinbelow.

In the first place, as shown in FIG. 10(a), through-holes 83 (only one through-hole 83 is shown in each of FIGS. 10(a) to 10(e)) are formed at predetermined places of an insulating substrate 82 such as a glass epoxy substrate or the like, applied with a sheet 81 on its one surface, while, onto the other surface, i.e., an under surface of the substrate 82, a first copper foil 84 is bonded. Then, electro-conductive paste 85 is filled in the through-holes 83 as shown in FIG. 10(b) by printing the sheet 81 as a printing mask. Thereafter, when the sheet 81 is separated from the insulating substrate 82 as shown in FIG. 10(c), the interior of the through-holes 83 is filled with the electro-conductive paste 85. However, there are cases where the electro-conductive paste 85 depending on the thickness of the sheet 81 in amount remains at the upper portion of the through-hole 83 in a state swelling or rising above the surface of the insulating substrate 82. Subsequently, as shown in FIG. 10(d), after applying a second copper foil 86 onto the upper surface of the insulating substrate 82, said substrate 82 and the copper foil 86 are perfectly bonded to each other, and simultaneously, the electro-conductive paste 85 is cured. Then, as shown in FIG. 10(e), the first copper foil 84 and the second copper foil 86 are selectively etched as required, thereby to form a first circuit pattern 87a and a second circuit pattern 87b as illustrated.

In the manner as described above, the first and second circuit patterns 87a and 87b are subjected to the inner-via-hole connection by the electro-conductive paste 85 filled in the through-holes 83, and thus, the two-layer printed circuit board 88 is obtained.

Subsequently, a manufacturing method of a conventional multilayer printed circuit board will be explained with respect to a four-layer printed circuit board as one example by referring to FIGS. 11(a) to 11(d).

In the first place, as shown in FIG. 11(a), an insulating substrate 92 provided with a sheet 91 on its one surface and formed with through-holes 93 at predetermined places thereof is stuck onto the first two-layer printed circuit board 88 prepared through the steps of FIGS. 10(a) to 10(e). Then, as illustrated in FIG. 11(b), electro-conductive paste 94 is filled in the through-holes 93 by printing a sheet 91 as a mask. Thereafter, when the sheet 91 is separated from the insulating substrate 92, the electro-conductive paste 94 is filled only in the through-holes 93 as shown in FIG. 11(c). Subsequently, as shown in FIG. 11(d), by applying and bonding the second two-layer circuit board 95 prepared by the steps similar to those in FIGS. 10(a) to 10(e) and formed with circuit patterns 96a and 96b, onto the insulating substrate 92, the four-layer printed circuit board is obtained.

However, in the conventional arrangements as described so far, there have been problems as follows.

Firstly, in the above known construction, there is a limitation in the content of the electro-conductive substances for the electro-conductive paste which may be used in the printing process for filling said paste into the through-holes, and this fact was unsuitable for reducing the resistance value of the electro-conductive paste, and that between the elecro-conductive paste and the metal foils. More specifically, when the content of the electro-conductive substances in the electro-conductive paste is increased for reducing the resistance value of the electro-conductive paste filled in the through-holes, fluidity of the paste is adversely affected, with consequent lowering of an aptitude for printing, thus tending to give rise to defects such as faulty filling and the like.

Therefore, in order to fill the electro-conductive paste into the through-hole of a small diameter, it is necessary to raise the fluidity of the electro-conductive paste to a certain extent. For the above purpose, the fluidity of the paste may be increased, with an improvement of the aptitude for printing if the content of the electro-conductive substances in the electro-conductive paste is decreased, but in that case, there is such a drawback that the resistance of the electro-conductive paste after curing is increased by an extent in which the content of the electro-conductive substances is reduced.

Secondly, in the conventional arrangements, there are cases where the electro-conductive paste 85 in the amount depending on the thickness of the sheet 81 remains in the state swelling or rising higher than the surface of the insulative substrate 82 as shown in FIG. 10(c). If the second copper foil 86 is applied onto the insulating substrate 82 in the above state, there is no place for the swollen electro-conductive paste 85 to escape, and in some cases, said paste penetrates into a gap between the second copper foil 86 and the insulating substrate 82 as shown in FIG. 12(a). If the second copper foil 86 for such insulating substrate 82 as referred to above is etched to form the second circuit pattern 87b, a short-circuiting path 85a is formed by the electro-conductive paste 85 which has penetrated into between the second copper foil 86 and the insulating substrate 82 as shown in FIG. 12(b), thus resulting in a short-circuiting fault with respect to near-by circuit patterns.

Due to the problems as described so far, the number of the inner-via-hole connections and circuit pattern density which can be formed per unit area are limited in the conventional organic substrates used for the printed circuits, and therefore, it is difficult to realize a multilayer circuit board for high density mounting which will be expanded in demand still more henceforth.

SUMMARY OF THE INVENTION

Accordingly, an essential object of the present invention is to provide a method of manufacturing an organic substrate used for printed circuits, which realizes a high performance printed circuit board at a high quality, wherein connecting resistance of electro-conductive paste and that between the electro-conductive paste and metal foils are reduced in the inner-via-hole connection, while maintaining a proper printing aptitude of the electro-conductive paste, with short-circuiting faults between the nearby inner-via-holes being eliminated, and to provide a printed circuit organic substrate produced by said manufacturing method, and also, a multi-layer printed circuit board constituted by said organic substrates.

Another object of the present invention is to provide a manufacturing method of the printed circuit organic substrate, and the organic substrate produced thereby of the above described type which is simple in construction and stable in functioning at high reliability, and can be readily manufactured at low cost.

In accomplishing these and other objects, according to one preferred embodiment of the present invention, there is provided a method of manufacturing an organic substrate used for printed circuits, which includes the steps of forming through-holes in a porous raw material provided with cover films and having compressive shrinkage and composed of a composite material of a non-woven fabric and a thermo-setting resin, filling electro-conductive paste into said through-holes, separating the cover films from said porous raw material filled with the electro-conductive paste in the through-holes thereof, applying metal foils onto the surface of said porous raw material from which said cover films have been separated, and compressing said porous raw material applied with said metal foils through heating and pressurization.

As described above, according to the present invention, by using the porous raw material made of the composite material of the non-woven fabric and thermo-setting resin, the through-holes may be readily filled with the electro-conductive paste comparatively small in the content of the electro-conductive substances, and superior in the aptitude for printing, while, owing to penetration of part of a binder component in the electro-conductive paste into porous portion of the non-woven fabric during the manufacturing process, composition ratio of the electro-conductive substance within the electro-conductive paste is increased.

Moreover, by the employment of the porous raw material having compressive shrinkage and composed of the non-woven fabric and thermo-setting resin, the electro-conductive paste is also compressed in the step in which the porous raw material is compressed through heating and pressurization, and in this case, the binder component is pressed out from between the electro-conductive substances, thereby strengthening binding between the electro-conductive substances, and that between the electro-conductive substances and metal foils for compacting the electro-conductive substances in the electro-conductive paste.

Furthermore, since the binder component of the electro-conductive paste filled in the through-holes is penetrated into the porous raw material side owing to the adoption of said porous raw material having the compressive shrinkage, the amount to be filled may be reduced, and thus the disadvantage that the electro-conductive paste enters between the porous raw material and the metal foils stuck onto the opposite surfaces of said porous raw material, can be eliminated, thereby preventing occurrence of short-circuiting faults between nearby circuit patterns.

BRIEF DESCRIPTION OF THE DRAWINGS

These and other objects and features of the present invention will become apparent from the following description taken in conjunction with the preferred embodiment thereof with reference to the accompanying drawing, in which;

FIGS. 1(a) to 1(e) are cross sectional diagrams for explaining a method of manufacturing an organic substrate used for printed circuits according to one preferred embodiment of the present invention.

DETAILED DESCRIPTION OF THE INVENTION

Figure 2:
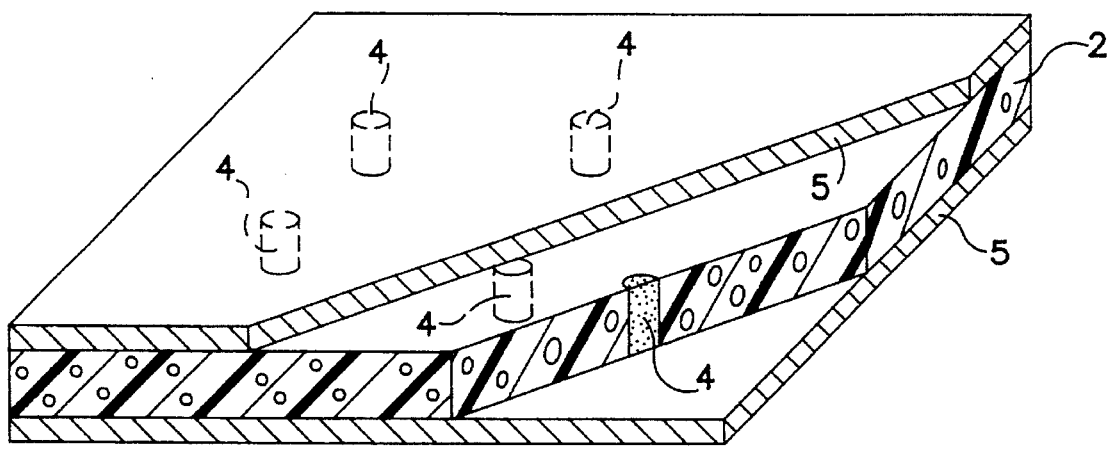
FIG. 2 is a perspective view, partly broken away, of an organic substrate used for printed circuits prepared by the method of FIGS. 1(a) to 1(e), FIGS. 3(a) to 3(f) are cross sectional diagrams for explaining a method of manufacturing an organic substrate used for printed circuits according to a second embodiment of the present invention.

Before the description of the present invention proceeds, it is to be noted that like parts are designated by like reference numerals throughout the accompanying drawings.

(Embodiment 1)

Referring now to the drawings, there is shown in FIGS. 1(a) to 1(e), a manufacturing method of an organic substrate for printed circuits according to one preferred embodiment of the present invention, with the construction of the organic substrate prepared by said method being illustrated in a perspective view of FIG. 2.

In the first place, as shown in FIG. 1(a), a porous base member or raw material 2 of $t_1$ in thickness and provided with free tackness films 1 of polyester or the like on its opposite surfaces is prepared. For this porous raw material 2, a base member of a composite material prepared for example, by impregnating a thermo-setting epoxy resin into non-woven fabric made of aromatic polyamide fibers and having small holes or voids 2a therein (referred to as aramid-epoxy sheet hereinafter) is employed. Here, a ratio in volume of the voids 2a to the aramid-epoxy sheet 2 is in the range of 10 to 60%. Then, as shown in FIG. 1(b), through-holes 3 are formed at predetermined places of the aramid-epoxy sheet 2 by utilizing laser processing, etc. Thereafter, as illustrated in FIG. 1(c), electro-conductive paste 4 is filled in the through-holes 3. It is to be noted here that the electro-conductive paste 4 is composed of silver powder as the conductive filler, and epoxy resin of non-solvent type for the binder, and prepared by mixing and kneading the silver powder and the binder, with the content of the silver powder set at 85 wt %. For filling the electro-conductive paste 4, the aramid-epoxy sheet 2 having the through-holes 3 is placed on a table of a printing machine (not shown), and the electro-conductive paste 4 is directly printed from above the cover film 1. In this case, the cover film 1 on the upper surface plays the parts for a printing mask, and for prevention of soiling on the surface of the aramid-epoxy sheet 2. At this stage, part of the binder in the electro-conductive paste 4 has already been penetrated into said aramid-epoxy sheet 2, and inside the electro-conductive paste 4, composition ratio of the electro-conductive substances with respect to the binder is gradually increasing. Subsequently, the cover films 1 are separated from the opposite surfaces of the aramid-epoxy sheet 2. Next, as shown in FIG. 1(d), metal foils 5 such as copper foils, etc. are stuck onto the opposite surfaces of the aramid-epoxy sheet 2. In this state, by heating and pressurization, the aramid-epoxy sheet 2 is compressed, while the aramid-epoxy sheet 2 and the metal foils 5 are bonded to each other as shown in FIG. 1(e). In the above case, conditions for the heating and pressurization are such that temperature is raised from a room temperature up to 200° C. in 30 minutes, while applying pressure of 60 kgf/cm$^2$ in vacuum, and then, held at 200° C. for 60 minutes for subsequent lowering down to the room temperature in 30 minutes. By the above step, the electro-conductive paste is also compressed, during which case, the binder component is pressed out from between the electro-conductive substances, and thus, binding between the electro-conductive substances, and between the electro-conductive substances and the metal foils are strengthened for compacting the electro-conductive substances in the electro-conductive paste, while the thickness of the aramid-epoxy sheet 2 is compressed to $t_2$, and the epoxy resin which is one composition of the aramid-epoxy sheet 2, and the electro-conductive paste 4 are cured. In the above case, the content of the electro-conductive substances in the electro-conductive paste has been raised up to 92.5 wt%.

More specifically, in the present embodiment, when an aramid-epoxy sheet having the thickness $t_1$ in the range of 150 to 220 μm, and porosity (means the ratio in volume of the voids 2a to porous raw material) at 10 to 60% is employed for the aramid-epoxy sheet 2, the thickness $t_2$ thereof after the compressing step by the heating and pressurization as shown in FIG. 1(e) becomes 60 to 200 m, and the porosity is reduced to 0 to 5%, with the size of the void 2a also becoming smaller. When the porosity of the aramid-epoxy sheet 2 is below 10%, the effect in which part of the binder of the electro-conductive paste 4 penetrates into the side of the aramid-epoxy sheet 2 is small, and if it is above 60%, voids remain in the organic substrate.

(Embodiment 2)

Subsequently, referring to FIGS. 3(a) to 3(f), a method of manufacturing a printed circuit organic substrate according to a second embodiment of the present invention will be described.

Figure 3A:
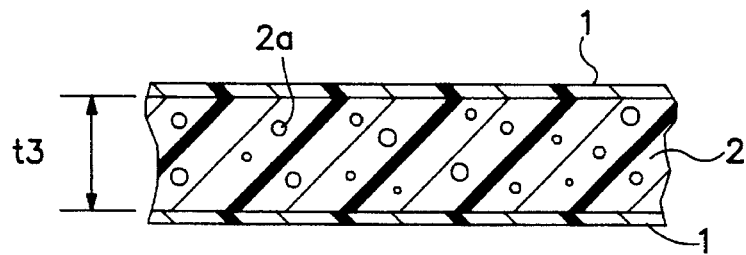
Figure 3B:
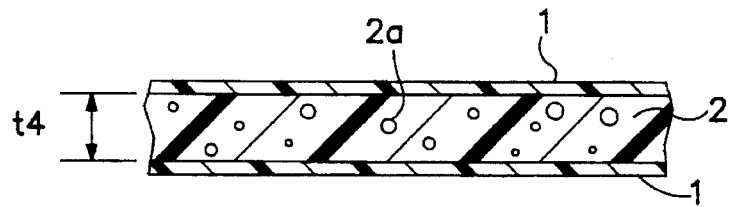
Figure 3C:
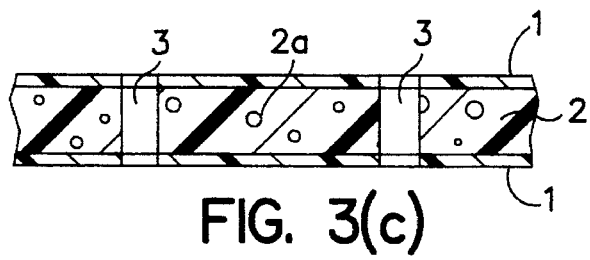
Figure 3D:
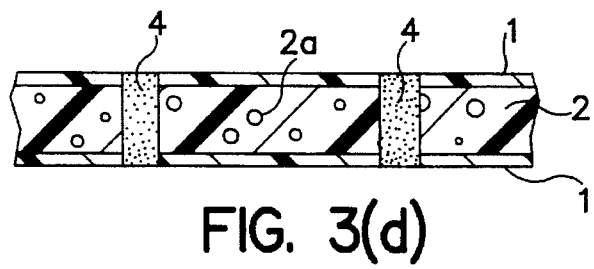
Figure 3E:
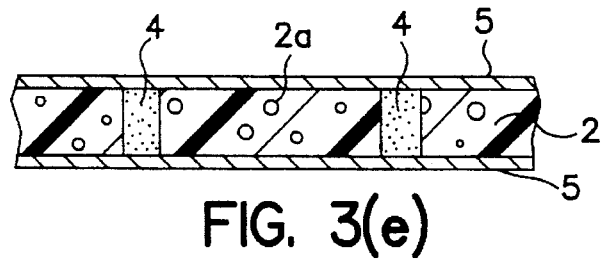
Figure 3F:
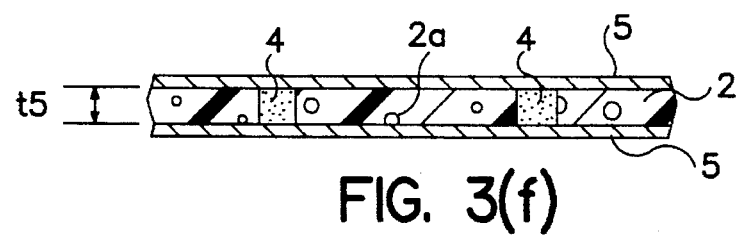

Firstly, an aramid-epoxy sheet 2 similar to that in the first embodiment is prepared as shown in FIG. 3(a), with the thickness of the sheet 2 set to be $t_3$. Then, as shown in FIG. 3(b), the aramid-epoxy sheet 2 is preliminarily compressed through heating and pressurization for 3 minutes at 100° C. and 25 kgf/cm$^2$. In this case, the aramid-epoxy sheet 2 is compressed to a thickness of $t_4$, with reduction of the porosity and the size of the void 2a. The purpose of such preliminary compression is to prevent the electro-conductive paste 4 from entering a boundary face between the aramid-epoxy sheet 2 and the metal foils 5 in the subsequent steps by improving adhesion between the cover films 1 and the aramid-epoxy sheet 2, and also, to control the amount of the binder in the electro-conductive paste 4 to be penetrated into the side of the aramid-epoxy sheet 2. Then, as shown in FIG. 3(c), through-holes 3 are formed at the predetermined positions in the aramid-epoxy sheet 2 through use of the laser processing, etc. Thereafter, as illustrated in FIG. 3(d), the electro-conductive paste 4 is filled into the through-holes 3. For filling the electro-conductive paste 4, the aramid-epoxy sheet 2 having the through-holes 3 is placed on a table of a printing machine (not shown), and the electro-conductive paste 4 is directly printed from above the cover film 1. In this case, the cover film 1 on the upper surface plays the parts for a printing mask, and for prevention of soiling on the surface of the aramid-epoxy sheet 2. At this stage, part of the binder in the electro-conductive paste 4 has already been penetrated into the side of said aramid-epoxy sheet 2, and inside the electro-conductive paste 4, composition ratio of the electro-conductive substances with respect to the binder is gradually increasing. Subsequently, the cover films 1 are separated from the opposite surfaces of the aramid-epoxy sheet 2. Next, as shown in FIG. 3(e), metal foils 5 such as copper foils, etc. are stuck onto the opposite surfaces of the aramid-epoxy sheet 2. In this state, by heating and pressurization, the aramid-epoxy sheet 2 is compressed, while the aramid-epoxy sheet 2 and the metal foils 5 are bonded to each other as shown in FIG. 3(f). In the above case, conditions for the heating and pressurization are such that temperature is raised from a room temperature up to 200° C. in 30 minutes, while applying pressure of 60 kgf/cm$^2$ in vacuum, and then, held at 200° C. for 60 minutes for subsequent lowering down to the room temperature in 30 minutes. By the above step, the electro-conductive paste is also compressed, during which case, the binder component is pressed out from between the electro-conductive substances, and thus, binding between the electro-conductive substances, and between the electro-conductive substances and the metal foils is strengthened for compacting the electro-conductive substances in the electro-conductive paste, while the thickness of the aramid-epoxy sheet 2 is compressed to $t_5$, and the epoxy resin which is one composition of the aramid-epoxy sheet 2, and the electro-conductive paste 4 are cured or hardened.

More specifically, in the above embodiment, when an aramid-epoxy sheet having the thickness $t_3$ in the range of 150 to 220 μm, and porosity at 40 to 60% is employed for the aramid-epoxy sheet 2, firstly, the thickness $t_4$ thereof after the preliminary compressing step by the heating and pressurization as shown in FIG. 3(b) becomes 100 to 150 μm, and the porosity is reduced to 10 to 30%, with the size of the void 2a also becoming smaller. Furthermore, the thickness $t_5$ thereof after the compressing step as shown in FIG. 3(f) becomes 90 to 100 μm, and the porosity is reduced to 0 to 5%, with the size of the void 2a also becoming smaller.

(Embodiment 3)

Referring further to FIGS. 4(a) to 4(f), a method of manufacturing a printed circuit organic substrate according to a third embodiment of the present invention will be described hereinafter.

Figure 4A:
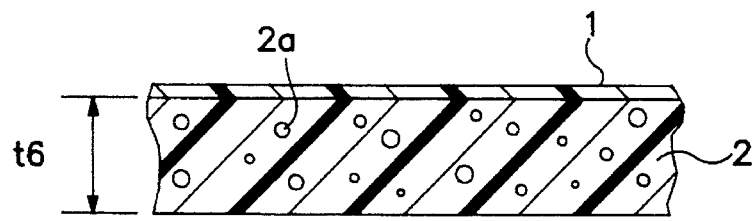
FIGS. 4(a) to 4(f) are cross sectional diagrams for explaining a method of manufacturing an organic substrate used for printed circuits according to a third embodiment of the present invention.
Figure 4B:
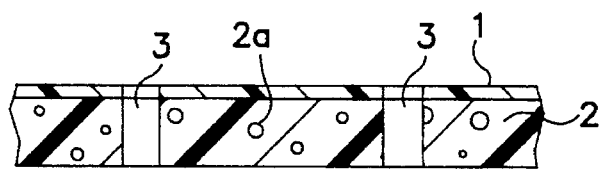
Figure 4C:
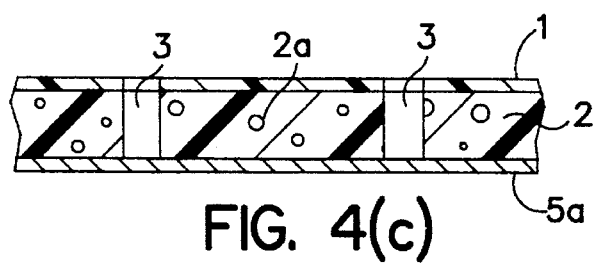
Figure 4D:
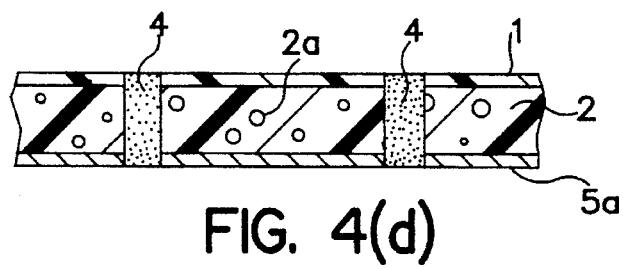
Figure 4E:
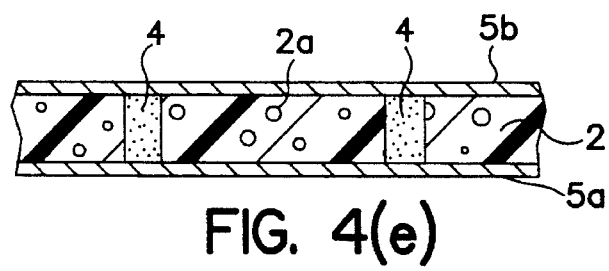

In the first place, as shown in FIG. 4(a), an aramid-epoxy sheet 2 of $t^6$ in thickness and provided with a cover film 1 of polyester or the like at least on its one surface is prepared. For this aramid-epoxy sheet 2, an aramid-epoxy sheet having the voids or holes 2a therein in the similar manner as in the first embodiment is employed. Then, as shown in FIG. 4(b), through-holes 3 are formed at predetermined places of the aramid-epoxy sheet 2 by utilizing laser processing, etc. Thereafter, as shown in FIG. 4(c), a first metal foil 5a of a copper foil or the like is applied onto the under surface of the aramid-epoxy sheet 2. It is to be noted that in the case where the porous raw material provided with the cover films 1 on its opposite surfaces is employed, the first metal foil 5a is stuck after separating the cover film at the under surface. Then, as shown in FIG. 4(d), the electro-conductive paste 4 is filled in the through-holes 3. For filling the electro-conductive paste 4, the aramid-epoxy sheet 2 having the through-holes 3 is placed on a table of a printing machine (not shown), and the electro-conductive paste 4 is directly printed from above the cover film 1. In this case, the cover film 1 on the upper surface plays the parts for a printing mask, and for prevention of soiling on the surface of the aramid-epoxy sheet 2. At this stage, part of the binder in the electro-conductive paste 4 has already been penetrated into the side of said aramid-epoxy sheet 2, and inside the electro-conductive paste 4, composition ratio of the electro-conductive substance with respect to the binder is gradually increasing. Subsequently, the cover film 1 is separated from the upper surface of the aramid-epoxy sheet 2. Next, as shown in FIG. 4(e), a second metal foil 5b such as a copper foil, etc. is stuck onto the upper surface of the aramid-epoxy sheet 2. In this state, by heating and pressurization, the aramid-epoxy sheet 2 is compressed, while onto the under-surface of the aramid-epoxy sheet 2, the first metal foil 5l is bonded, with the second metal foil 5b being bonded to the upper surface of said sheet 2. In the above case, conditions for the heating and pressurization are such that temperature is raised from a room temperature up to 200° C. in 30 minutes, while applying pressure of 60 kgf/cm² in vacuum, and then, held at 200° C. for 60 minutes for subsequent lowering down to the room temperature in 30 minutes.

By the above step, the electro-conductive paste is also compressed, during which case, the binder component is pressed out from between the electro-conductive substances, and thus, binding between the electro-conductive substances, and between the electro-conductive substances and the metal foils is strengthened for compacting the electro-conductive substances in the electro-conductive paste, while the thickness of the aramid-epoxy sheet 2 is compressed to $t_7$, and the epoxy resin which is one composition of the aramid-epoxy sheet 2, and the electro-conductive paste 4 are cured.

Figure 4F:
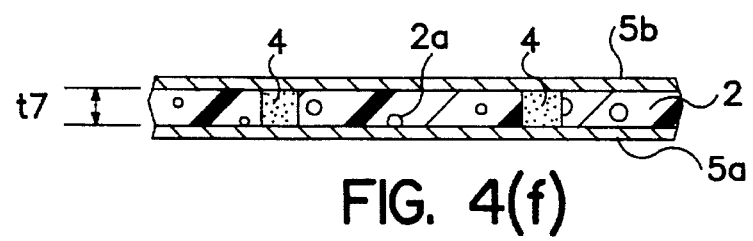

More specifically, in the above embodiment, when an aramid-epoxy sheet having the thickness $t_6$ in the range of 150 to 220 μm, and porosity at 10 to 60% is employed for the aramid-epoxy sheet 2, the thickness $t_7$ thereof after the compressing step by the heating and pressurization as shown in FIG. 4(f) becomes 60 to 200 μm, and the porosity is reduced to 0 to 5%, with the size of the void 2a also becoming small.

It is to be noted here that as the aramid-epoxy sheet 2 shown in FIG. 4(a), the sheet reduced in its thickness and porosity by the preliminary compression described earlier as used in the second embodiment may be employed.

For the electro-conductive substances contained in the electro-conductive paste 4 used in the first, second and third embodiments as described so far, silver, gold, silver palladium, copper, and more than one kind of alloys thereof may be employed. Additionally, the configuration of the electro-conductive substance particles should preferably be of a spherical shape. More specifically, by using spherical metal particles for the electro-conductive substances, the binder may be readily pressed out from the contact portions among the metal particles when pressure is applied to the electro-conductive paste 4, and also, since the contact portions of the metal particles to each other are easily subjected to plastic deformation, the metal particles, and the metal particles and the metal foils are strongly bound to each other, and thus, resistance during the inner-via-hole connection can be reduced to a large extent.

Similarly, in the first, second or third embodiment, the step for compressing the aramid-epoxy sheet 2 held between the metal foils 5 through heating and pressurization may be so modified, for example, as to be constituted by a first step for rasing viscosity of the electro-conductive paste 4 and a second step for bonding the metal foils 5 and the aramid-epoxy sheet 2. In this case, since the viscosity of the electro-conductive paste 4 is first raised in the first step, entry of the electro-conductive paste 4 into the boundary face between the aramid-epoxy sheet 2 and the metal foils 5 can be advantageously prevented. This fact displays its intend effect particularly when the interval between the through-holes 3 becomes small in the printed circuit boards for a high density mounting.

Meanwhile, in the first, second or third embodiment, by setting the gel point of the electro-conductive paste 4 to be lower than the softening temperature of the epoxy resin which is one of the compositions of the aramid-epoxy sheet 2, since gelation of the electro-conductive paste is first started in the step for compressing the aramid-epoxy sheet 2 held between the metal foils 5 through heating and pressurization, and after rising of the viscosity thereof to a certain extent, the softening of the epoxy resin as one of the compositions of the sheet 2 is started, the undesirable entry of the electro-conductive paste 4 into the boundary face between the sheet 2 and the metal foils 5 can be prevented. This fact also displays its effect especially when the interval between the through-holes 3 is reduced in the printed circuit board for a high density mounting.

Figure 5:
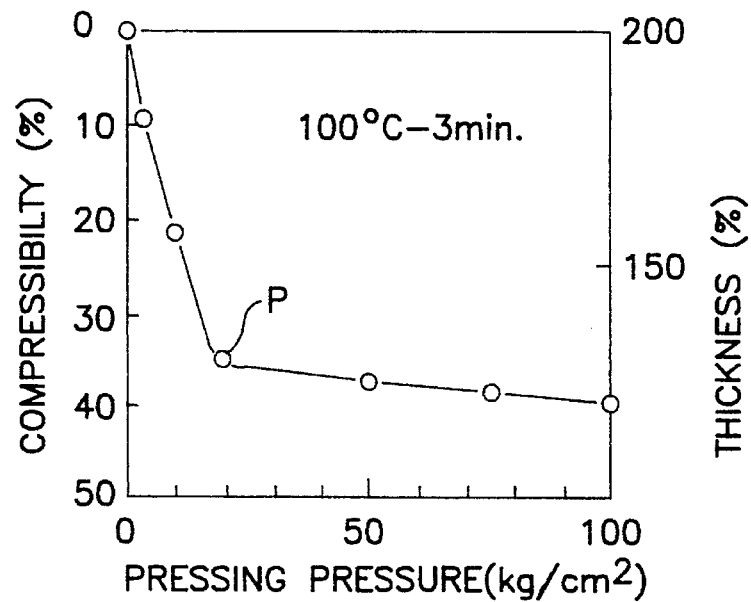
FIG. 5 is a graphical diagram showing relation among pressing pressure for compressing a porous raw material, compressibility and thickness.

Subsequently, the compression of the porous raw material through heating and pressurization, which plays a particularly important role in the first, second or third embodiment will be explained hereinbelow. The compressibility is represented by a following equation (1), $$\text{Compressibility} = (T-t)/T \qquad (1)$$

wherein T is the thickness of the porous raw material before heating and pressurization, and t is the thickness of the aramid-epoxy sheet 2 after the heating and pressurization. In FIG. 5, there is shown a graphical diagram showing relation among pressing pressure for compressing the porous raw material, the compressibility, and the thickness, when the aramid-epoxy sheet of 200 μm in thickness, with the porosity of 40% is used for the porous raw material, and the pressurization is effected for 3 minutes at 100° C.

· As shown in FIG. 5, although the thickness of the porous raw material is reduced as the pressing pressure increases, the variation of the thickness is reduced when the pressing pressure exceeds a transition point P of the compressibility. The compressibility is obtained by substituting the variation of the thickness for the equation (1).

Accordingly, it is preferable that the preliminary compression to be carried out in the step of FIG. 3(b) of the second embodiment is effected in a region before reaching the transition point P of the compressibility as shown in FIG. 5, and that the compressions to be conducted in the steps of FIG. 3(f), FIG. 1(e), and FIG. 4(f) are effected in a region after the transition point P of the compressibility.

Figure 6:
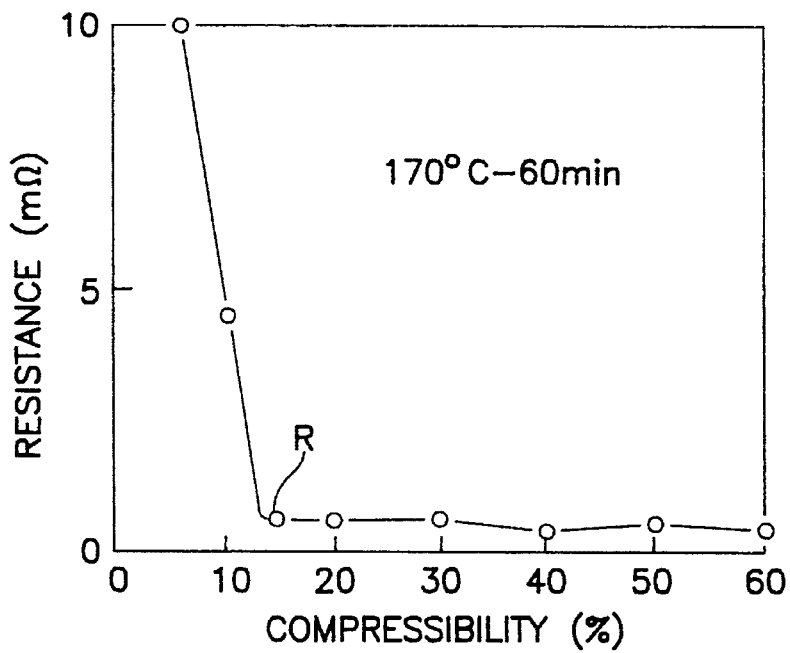
FIG. 6 is also a graphical diagram showing relation between compressibility and resistance value of electro-conductive paste filled in the through-holes.

A graphical diagram of FIG. 6 shows the relation between the compressibility and resistance of the electro-conductive paste filled in the through-holes, with the ordinate representing the resistance value per one through-hole.

The samples used for the measurements in FIG. 6 were prepared in the manner as follows.

In the first place, an aramid-epoxy sheet of 200 μm in thickness was used as the porous raw material, and after preliminary compression for 3 minutes at 100° C. and 25 kgf/cm$^2$, the sheet was formed with through-holes each having a diameter of 0.2 mm by the use of a laser processing. Then, after electro-conductive paste prepared by dispersing silver powder as the metal particles into a non-solvent type epoxy resin as a binder, was filled in each through-hole, copper foils were stuck onto the opposite surfaces of the aramid-epoxy sheet, which was then processed in such conditions that temperature was raised from a room temperature up to 200° C. in 30 minutes, while applying pressure of 60 kgf/cm$^2$ in vacuum, and then, held at 200° C. for 60 minutes for subsequent lowering down to the room temperature in 30 minutes. Thereafter, the copper foils at the opposite surfaces of the sheet were etched, and circuit patterns having 500 through-holes connected in series were formed, and by measuring the total resistance of the circuit patterns, the resistance value per one through-hole was calculated.

As shown in FIG. 6, the resistance value was rapidly reduced as the compressibility increases, and when the compressibility exceeded a transition point R of the resistance value, variation of the resistance value was reduced, and a stable electrical connection was obtained.

(Embodiment 4)

Figure 7:
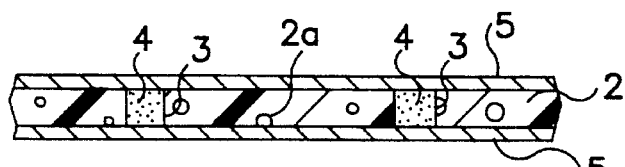
FIG. 7 is a fragmentary cross sectional view of the printed circuit organic substrate according to the present invention.

Referring further to FIG. 7, an organic substrate for the printed circuits according to one embodiment of the present invention will be described hereinbelow.

As shown in FIG. 7, in the printed circuit organic substrate of the present embodiment, the metal foils 5 stuck to the opposite surfaces of the aramid-epoxy sheet 2 are electrically connected by the electro-conductive paste 4 filled in the through-holes 3 provided in said sheet 2. The electro-conductive paste 4 filled in the through-holes 3 is gradually increased in its composition ratio of the electro-conductive substances after the step for filling said paste 4, and in the compression step after bonding of the metal foils 5, the binder component is pressed out from between the electro-conductive substances, thus, the binding between the electro-conductive substances, and also, between the electro-conductive substances and metal foils being strengthened. Consequently, in the electro-conductive paste 4 according to the present embodiment, the electro-conductive substances are more compacted than those in the electro-conductive paste employed in the conventional inner-via-hole-connections.

(Embodiment 5)

Referring to FIGS. 8(a) to 8(i), a method of manufacturing a multilayer printed circuit board according to a further embodiment of the present invention will be described hereinafter.

Figures 8A, 8C:
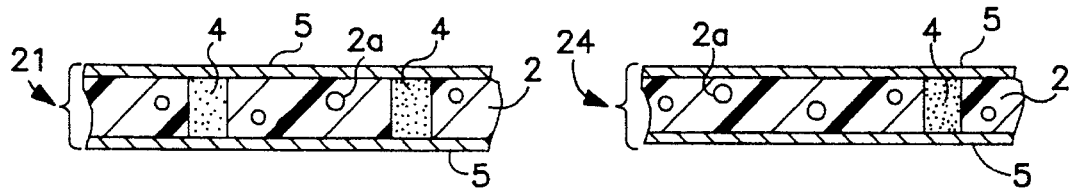
FIGS. 8(a) to 8(i) are fragmentary cross sectional diagrams for explaining a method of manufacturing a multi-layer printed circuit board according to one embodiment of the present invention.
Figures 8B, 8D:
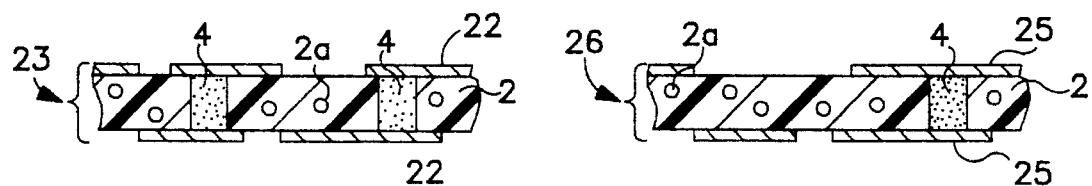
Figures 8E, 8F:
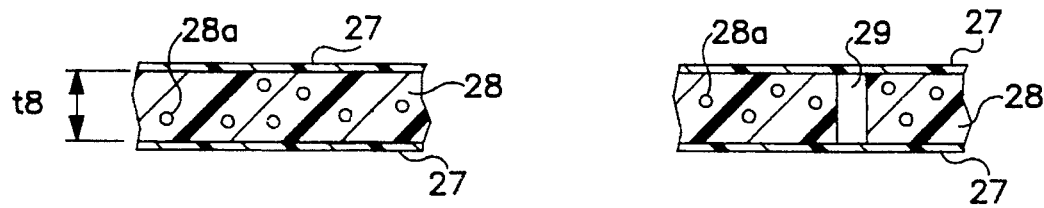
Figures 8G, 8H:
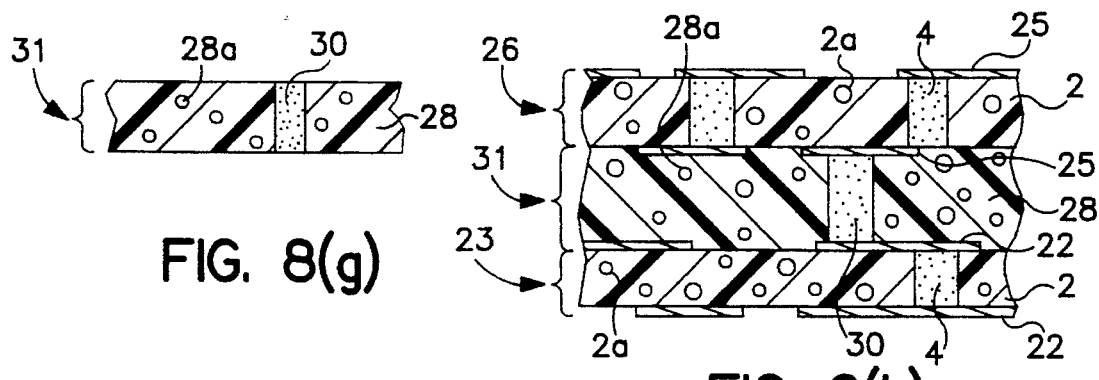
Figure 8I:
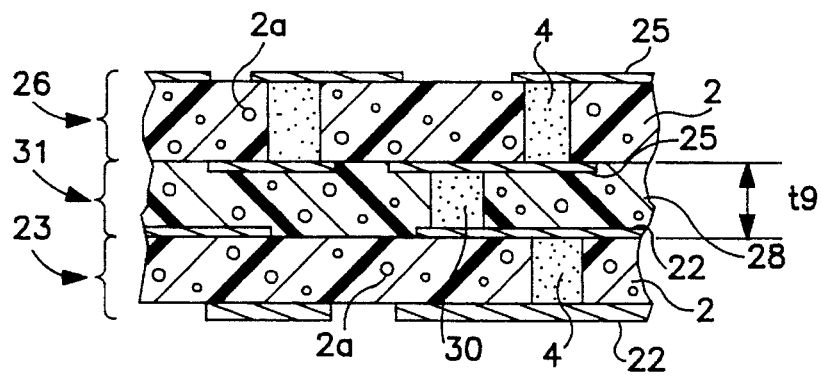
Figure 9:
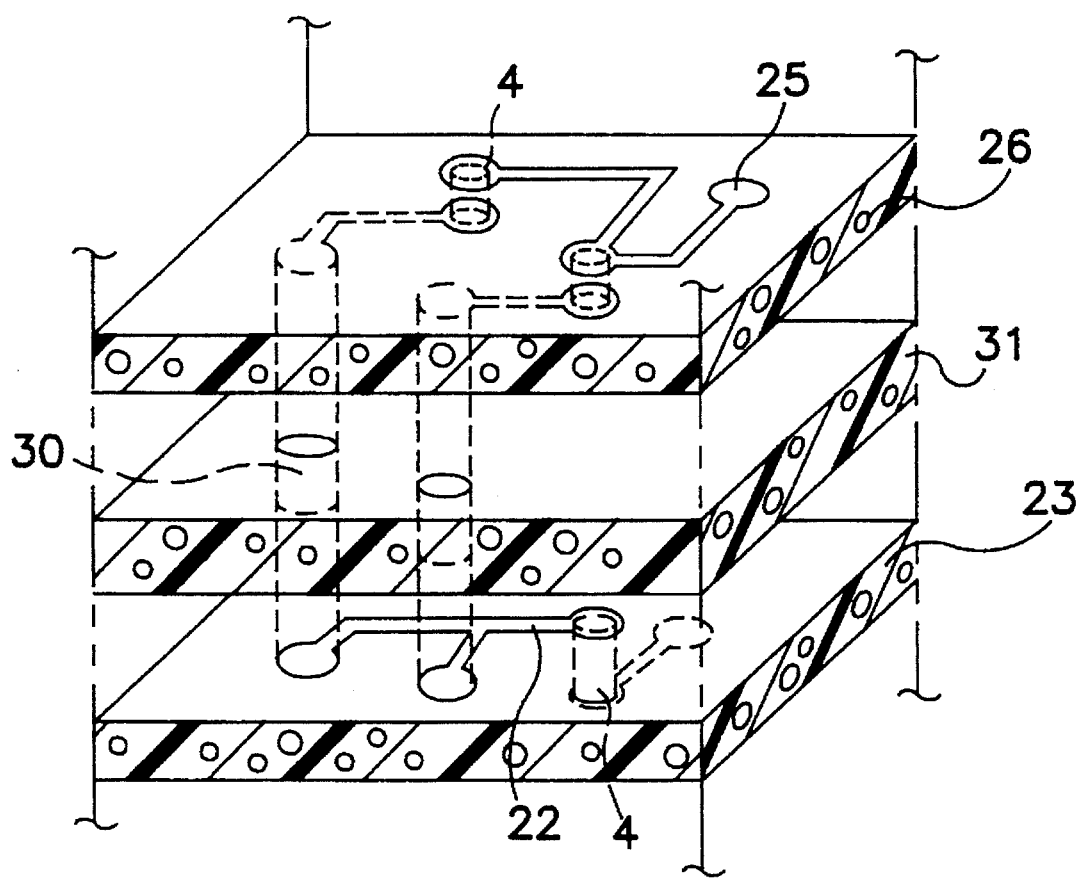
FIG. 9 is an exploded perspective view of the multilayer printed circuit board produced by the method of FIGS. 8(a) to 8(i), FIGS. 10(a) to 10(e) are fragmentary cross sectional diagrams for explaining a manufacturing method of a conventional two-layer printed circuit board (already referred to)
Figure 10A:
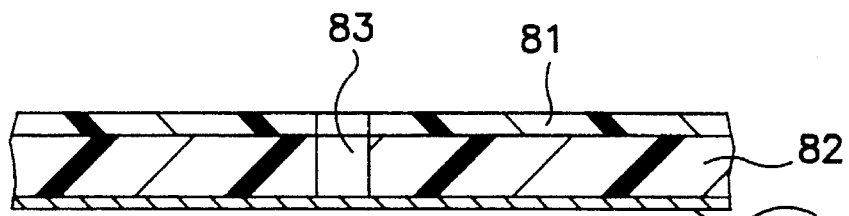
Figure 10B:
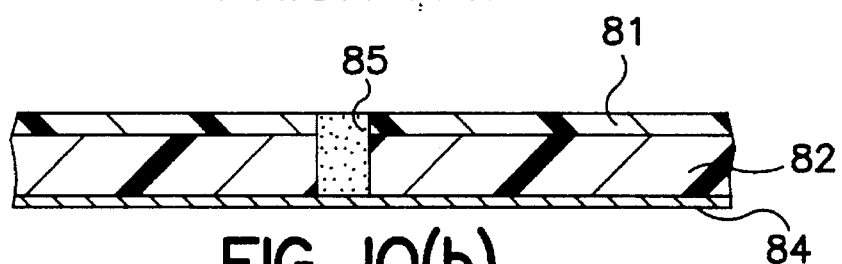
Figure 10C:
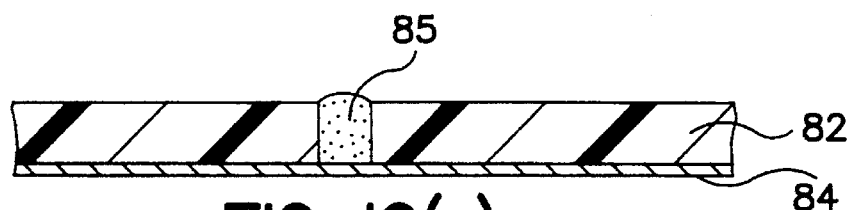
Figure 10D:
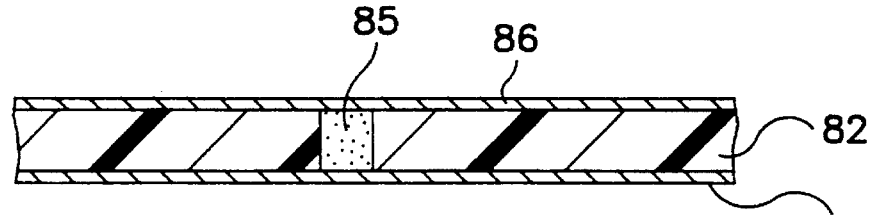
Figure 10E:
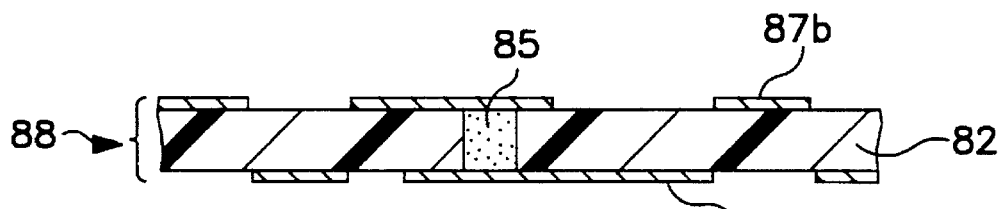
Figure 11A:
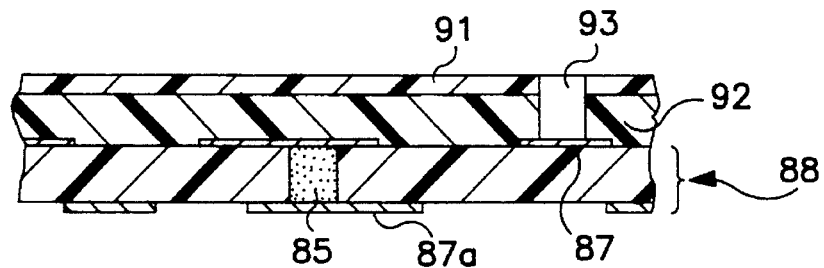
FIGS. 11(a) to 11(d) are fragmentary cross sectional diagrams for explaining a manufacturing method of a conventional multilayer printed circuit board.
Figure 11B:
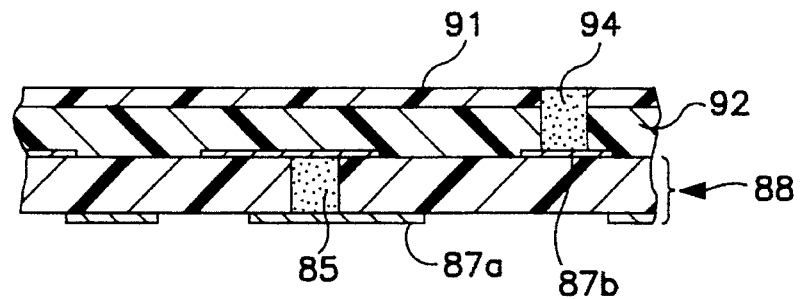
Figure 11C:
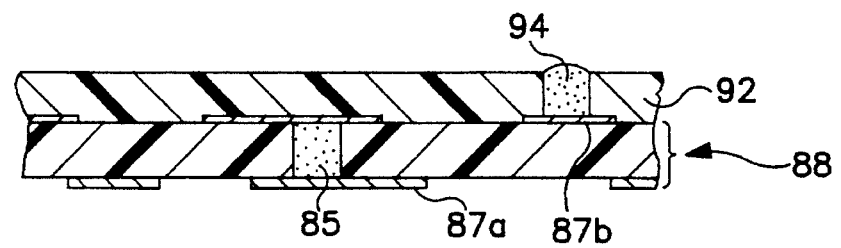
Figure 11D:
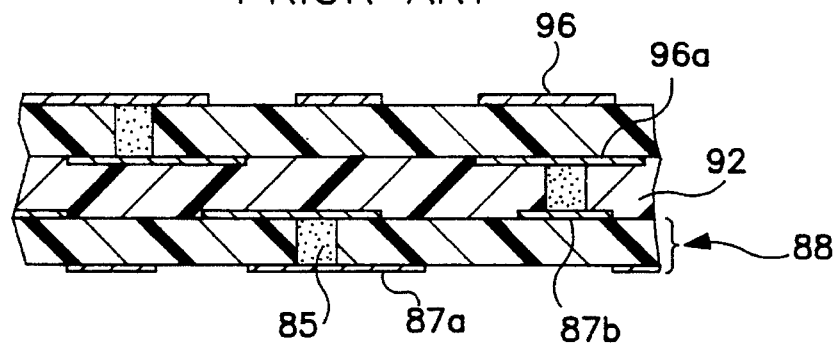
Figure 12A:
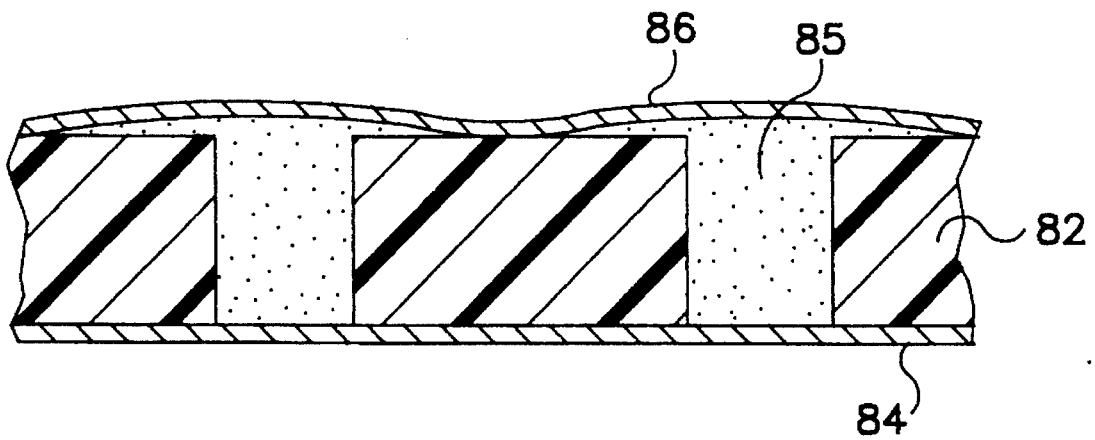
FIGS. 12(a) to 12(b) are also fragmentary cross sectional diagrams for explaining problems related to the manufacturing method of the conventional two-layer printed circuit board.
Figure 12B:
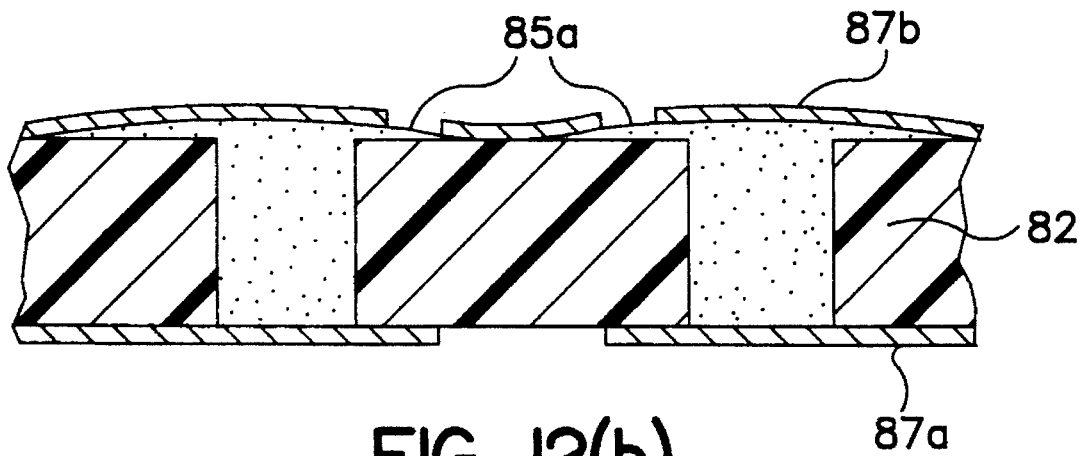

It is to be noted here that FIGS. 8(a) and 8(b) show steps for forming a first circuit board, FIGS. 8(c) and 8(d) denote steps for forming a second circuit board, FIGS. 8(e) to 8(g) relate to steps for forming an intermediate connecting member to be used for lamination of the first and second circuit boards for connection to each other, and FIGS. 8(h) and 8(i) show steps for forming the intended multilayer circuit boards by laminating the first and second circuit boards, with the intermediate connecting member disposed therebetween, respectively. FIG. 9 shows an exploded perspective view of the multilayer printed circuit board produced by the above steps.

In the first place, as shown in FIG. 8(a), a first printed circuit organic substrate 21 formed by the method as described earlier with reference to FIGS. 1(a) to 1(e), FIGS. 3(a) to 3(f) or FIGS. 4(a) to 4(f) is prepared. Then, as shown in FIG. 8(b), the metal foils 5 such as copper foils or the like applied onto the opposite surfaces of the substrate 21 are etched by the ordinary pattern forming method, thereby to produce a first circuit board 23 provided with circuit patterns 22. Similarly, by processing the second printed circuit organic substrate 24 as shown in FIGS. 8(c) and 8(d), a second circuit board 26 provided with circuit patterns 25 is prepared. It is to be noted here that each of these circuit boards 23 and 26 may be used as a two-layer circuit board in this state.

Apart from the manufacturing steps of the first circuit board 23 and the second circuit board 26, the intermediate connecting member 31 is manufactured based on the steps of FIGS. 8(e) to 8(g).

Firstly, as shown in FIG. 8(e), an aramid-epoxy sheet 28 of $t_8$ in thickness provided with cover films 27 is prepared. Then, as shown in FIG. 8(f), through-holes 29 are formed at the predetermined positions in the aramid-epoxy sheet 28 through use of the laser processing, etc. Thereafter, as illustrated in FIG. 8(g), the electro-conductive paste 30 is filled into the through-holes 29. For filling the electro-conductive paste 30, the aramid-epoxy sheet 28 having the through-holes 29 is placed on a table of a printing machine (not shown), and the electro-conductive paste 30 directly printed from above the cover film 27. In this case, the cover film 1 on the upper surface plays the parts for a printing mask, and for prevention of soiling on the surface of the aramid-epoxy sheet 28. After printing the electro-conductive paste 30, the cover films 27 are removed to produce the intermediate connecting member 31. It is to be note here that in the steps of FIGS. 8(h) and 8(i), the through-holes 29 are formed by the required number so as to correspond to the circuit patterns to be connected to each other.

Subsequently, the steps for laminating the first circuit board 23 and the second circuit board 26 by using the intermediate connecting member 31 will be explained hereinbelow.

In the first place, as shown in FIGS. 8(h), the intermediate connecting member 31 is placed on the first circuit board 23, with the second circuit substrate 26 is further piled thereon. Then, as shown in FIG. 8(i), the first circuit board 23 and the second circuit board 26 are bonded to each other by heating and pressurization, while the circuit patterns 22 and 25 are subjected to the inner-via-hole-connection by the electro-conductive paste 4 and 30. In this process, the intermediate connecting member 31 is compressed to a thickness $t_9$ and cured, with the electro-conductive paste being also cured.

More specifically, in the manufacturing steps of the intermediate connecting member according to the present embodiment, when an aramid-epoxy sheet having the thickness $t_8$ in the range of 150 to 220 μm, and porosity at 10 to 60% is employed for the aramid-epoxy sheet 28, the thickness $t_9$ thereof after the compressing step by the heating and pressurization as shown in FIG. 8(h) becomes 60 to 200 μm, and the porosity is reduced down to 0 to 5%.

Meanwhile, in order to produce a multilayer circuit board having a still more number of lamination, it may be so arranged to prepare the required number of circuit boards and intermediate connecting members for inter-connection therebetween, thereby to laminate at one time through heating and pressurization after inserting the intermediate connecting members between the respective circuit boards, or to pile up the intermediate connecting members and circuit boards one set by one set by repeating the step of FIG. 8(h) for lamination through heating and pressurization.

It is to be noted here that a multilayer circuit board may also be manufactured in such a practice that, by laminating the intermediate connecting member on the circuit board, the other metal foil is further laminated thereon, and after bonding the circuit board, the intermediate connecting member and the other metal foil through heating and pressurization, said the other metal foil is etched to form the circuit pattern, or by repeating the above practice.

In the manufacturing method of the multilayer circuit boards as described so far, since the electro-conductive paste 30 is sufficient filled in the state where the under face of each through-hole 29 of the intermediate connecting member 31 is opened, it is possible to inspect the 10 intermediate connecting member 31 as a single member after the step of FIG. 8(g), by using an optical means, etc. Accordingly, in the step of FIG. 8(h), the first circuit board 23, the second circuit board 26 and the intermediate connecting member 31 are to be an laminated in the state where they have been examined, a high manufacturing yield can be maintained to suppress cost increase. On the other hand, in the conventional manufacturing process of the multilayer circuit board, since the member equivalent to the intermediate connecting member 31 of the present embodiment is formed in the manner as direct laminated on the circuit board 88 as shown in FIGS. 11(a) to 11(d), if any fault occurs at the respective steps, the circuit board 88 which is a good product must be discarded simultaneously, thus resulting in a cost increase.

Furthermore, in the multilayer circuit board produced by the manufacturing method of the present invention as described so far, since the first and second circuit boards 23 and 26 are connected to each other by the use of the intermediate connecting member 31 to be compressed by the heating and pressurization and the electro-conductive substances in the electro-conductive paste 30 is compacted, while the contact between the electro-conductive substances and the circuit patterns 22 and 25 is improved, the resistance during the inner-via-hole connection is remarkably reduced, and therefore, upon application thereof to the circuit board at high density or multilayer in which the number of the inner-via-hole connections is increased, the effect as described above becomes still more conspicuous.

As is clear from the foregoing description, according to the present invention, the method of manufacturing the organic substrate used for printed circuit includes the steps of forming through-holes in the porous raw material provided with the cover films and having compressive shrinkage, filling the electro-conductive paste into said through-holes, applying the metal foils onto the surface of said porous raw material from which said cover films have been separated, and compressing said porous raw material applied with said metal foils by heating and pressurization, and therefore, the method of manufacturing the organic substrate used for printed circuits having a highly reliable inner-via-hole connection at a low resistance, and the organic substrate manufactured thereby can be realized.

More specifically, according to the present invention, since the electro-conductive paste can be readily filled into the through-holes by using the paste comparatively small in the content of electro-conductive material and superior in the aptitude for printing, and moreover, part to the binder component in the electro-conductive paste is penetrated into the voids of the porous raw material in the manufacturing process, with the composition ratio of the electro-conductive substances in the electro-conductive paste being increased, the inner-via-hole-connection at low resistance can be realized.

Moreover, in the step of heating and pressurizing the porous raw material after application of the metal foils, the electro-conductive paste is also metal foils, the electro-conductive paste is also compressed, and in this case, the binder component is pressed out from between the electro-conductive substances, and the binding between the electro-conductive substances, and between the electro-conductive substances and the metal foils is strengthened, thereby compacting the electro-conductive substances in the electro-conductive paste.

Therefore, according to the present invention, the high density circuit board requiring the inner-via-hole connection with through-holes of a very small diameter, the high multilayer circuit board necessitating a large number noise or for high frequency in which low circuit impedance is required, noises in which low circuit impedance is required, or high etc. can be readily realized.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as included therein.

What is claimed is:

1. A method of manufacturing an organic substrate used for printed circuits, which comprises the steps of forming through-holes in a porous raw material provided with free tackness films and having compressive shrinkage comprising a composite material of a non-woven fabric and a thermosetting resin, filling electro-conductive paste into said through-holes, separating the free tackness films from said porous raw material filled with the electro-conductive paste in the through-holes thereof, applying metal foils onto the surfaces of said porous raw material from which said free tackness films have been separated, and then compressing said porous raw material applied with said metal foils through heating and pressurization.

2. A method of manufacturing an organic substrate used for printed circuits, which comprises the steps of forming through-holes in a porous raw material provided with free tackness films and having compressive shrinkage comprising a composite material of a non-woven fabric and a thermosetting resin, filling electro-conductive paste into said through-holes, and also increasing composition ratio of the electro-conductive material with respect to a binder in the electro-conductive paste, separating the free tackness films from said porous raw material filled with the electro-conductive paste in the through-holes thereof, applying metal foils onto the surface of said porous raw material from which said free tackness films have been separated, and then compressing said porous raw material applied with said metal foils through heating and pressurization so as to make more compact, the electro-conductive material in said electro-conductive paste.

3. The method as claimed in claim 1 or 2, wherein the step of compressing the porous raw material through heating and pressurization, the compressibility therefor is in the range of 10 to 60%.

4. The method as claimed in claim 1 or 2, wherein, before the step for filling the electro-conductive paste into the through-holes, another step of preliminarily compressing the porous raw material provided with the cover films and having compressive shrinkage is added.

5. The method as claimed in claim 1 or 2, wherein said porous raw material provided with the free tackness films and having compressive shrinkage is mainly composed of an organic material, with a porosity of said porous raw material being in the range of 10 to 60%.

6. The method as claimed in claim 1 or 2, wherein the electro-conductive filler within the electro-conductive paste is a substance selected from the group consisting of powder of silver, gold, silver palladium, copper, and alloys thereof.

7. The method as claimed in claim 1 or 2, wherein the step of compressing the porous raw material 2 applied with the metal foils on its opposite surfaces through heating and pressurization further includes a first step for increasing viscosity of the electro-conductive paste, and a second step of bonding said metal foils to said porous raw material.

8. The method as claimed in claim 1 or 2, wherein a gel point of the electro-conductive paste is lower than a softening temperature of a resin constituting the porous raw material.

9. A method of manufacturing a multilayer circuit board which comprises the steps of:

producing circuit boards each by forming circuit patterns on opposite surfaces of a printed circuit organic substrate obtained by the steps of forming through-holes in a porous material provided with cover films and having compressive shrinkage, filling electro-conductive paste into said through-holes, separating the cover films from said porous raw material filled with the electro-conductive paste in the through-holes thereof, applying metal foils onto the surfaces of said porous raw material from which said free tackness porous raw material applied with said metal foils through heating and pressurization.

producing an intermediate connecting member by forming through-holes in the porous raw material and filling electro-conductive paste into said through-holes, and then holding said intermediate connecting member between at least one pair of said circuit boards for subsequent heating and pressurization thereof.

10. A method of manufacturing a multilayer circuit board which comprises the steps of:

producing circuit boards each by forming printed patterns on opposite surfaces of a printed circuit organic substrate obtained by the steps of forming through-holes in a porous raw material provided with free tackness films and having compressive shrinkage, filling electro-conductive paste into said through-holes, and also increasing composition ratio of the electro-conductive paste, separating the free tackness films from said porous raw material filled with the electro-conductive paste in the through-holes thereof, applying metal foils onto the surfaces of said porous raw material from which said free tackness films have been separated, and compressing said porous raw material applied with said metal foils through heating and pressurization so as to make more compact, the electro-conductive material in said electro-conductive paste, producing an intermediate connecting member by forming through-holes in the porous raw material and filling electro-conductive paste into said through-holes, applying said intermediate connecting member on said circuit board, and heating and pressurizing after applying other metal foils thereon, and forming circuit patterns by processing said other metal foils.

* * * * *